US 6,550,911 B2

(12) United States Patent
Park

(10) Patent No.: US 6,550,911 B2
(45) Date of Patent: Apr. 22, 2003

(54) TESTING DIES ON A SEMICONDUCTOR WAFER IN A SEQUENTIAL AND OVERLAPPING MANNER

(76) Inventor: Eungjoon Park, 2861 Alice Ct., Fremont, CA (US) 94539

( * ) Notice: Subject to any disclaimer, the term of this patent is extended or adjusted under 35 U.S.C. 154(b) by 0 days.

(21) Appl. No.: 09/930,011

(22) Filed: Aug. 14, 2001

(65) Prior Publication Data

US 2002/0001863 A1 Jan. 3, 2002

Related U.S. Application Data

(62) Division of application No. 09/542,802, filed on Apr. 4, 2000, now Pat. No. 6,323,639.

(51) Int. Cl.$^7$ .................................................. G02C 7/10
(52) U.S. Cl. ........................................................ 351/44
(58) Field of Search ........................ 351/44; 324/158.1; 438/113; 257/754

(56) References Cited

U.S. PATENT DOCUMENTS 5,404,099 A  4/1995  Sahara .................... 324/158.1
6,196,677 B1 *  3/2001  Spano ........................ 351/44

* cited by examiner

Primary Examiner—John F. Niebling
Assistant Examiner—Andre' C. Stevenson

(57) ABSTRACT

In accordance with the present invention, a plurality of dies on a wafer are tested as follows. The wafer is placed in a tester. A built-in self test (BIST) operation is initiated in a first die. Another BIST operation is initiated in a second die after initiating the BIST operation in the first die such that the BIST operation in the first die and the BIST operation in the second die overlap.

8 Claims, 1 Drawing Sheet

TESTING DIES ON A SEMICONDUCTOR WAFER IN A SEQUENTIAL AND OVERLAPPING MANNER

CROSS-REFERENCE TO RELATED APPLICATIONS

This application is a divisional of U.S. application Ser. No. 09/542,802, filed Apr. 4, 2000, now U.S. Pat. No. 6,323,639B1, entitled "Powering Dies on a Semiconductor Wafer Through Wafer Scribe Line Areas", which disclosure is incorporated herein by reference.

BACKGROUND OF THE INVENTION

This invention relates to semiconductor devices, and more particularly to a structure for and a method of supplying power to the dies on a wafer during wafer testing.

As the complexity of semiconductor devices increases, the amount of time required to properly test these devices also increases. For example, with advancing technology, memory devices increase in density and complexity, and the time to properly test all memory cells and the different functions of these memory devices increases significantly. Given the high volume production of some memory devices and other semiconductor devices, the increase in test time and the corresponding testing cost can significantly increase the cost of the product.

Conventional testing of semiconductor devices includes a number of steps which can broadly be grouped into two: (i) wafer sort, for identifying defective dies at wafer level, and (ii) final test, for identifying defective packaged devices. While at final test multiple packaged devices, e.g., 8, 16, or 64, can be tested simultaneously, at wafer sort, the dies are tested sequentially. Thus, wafer sort time is significantly longer than final test time.

Conventionally, each die on a wafer is tested by placing a probe card connected to a test equipment on the contact pads of the die. The probe card supplies the proper power supply levels and control signals to the contact pads on the die. The electrical contact between the probe card and the die contact pads is maintained until the testing of the die is completed. The probe card is then moved to the next die, and the same steps are repeated. Because the number of dies on a wafer is increasing rapidly due to the increasing wafer size and the decreasing processing feature sizes, this method of sequential testing of the dies on a wafer can significantly increase the wafer sort time and cost. Thus, reducing the wafer sort time is desirable.

SUMMARY OF THE INVENTION

In accordance with the present invention, wafer testing time is significantly reduced by initiating built-in self test (BIST) operation in each of the dies of the wafer in such way that the BIST operation in a number of the dies overlap.

In one embodiment, a plurality of dies on a wafer are tested as follows. The wafer is placed in a tester. A built-in self test (BIST) operation is initiated in a first die. Another BIST operation is initiated in a second die after initiating the BIST operation in the first die such that the BIST operation in the first die and the BIST operation in the second die overlap.

In another embodiment, each of the plurality of dies has a circuit, and upon initiating each of the BIST operations, power is supplied to the circuit, designed-in test operations are performed, data reflecting the results of the designed-in test operations are stored in a register, and power is removed from the circuit.

In another embodiment, the data stored in the register of each die is evaluated upon completion of the BIST operations to determine the action to be taken with respect to each die.

DESCRIPTION OF THE SPECIFIC EMBODIMENTS

Figure 1:
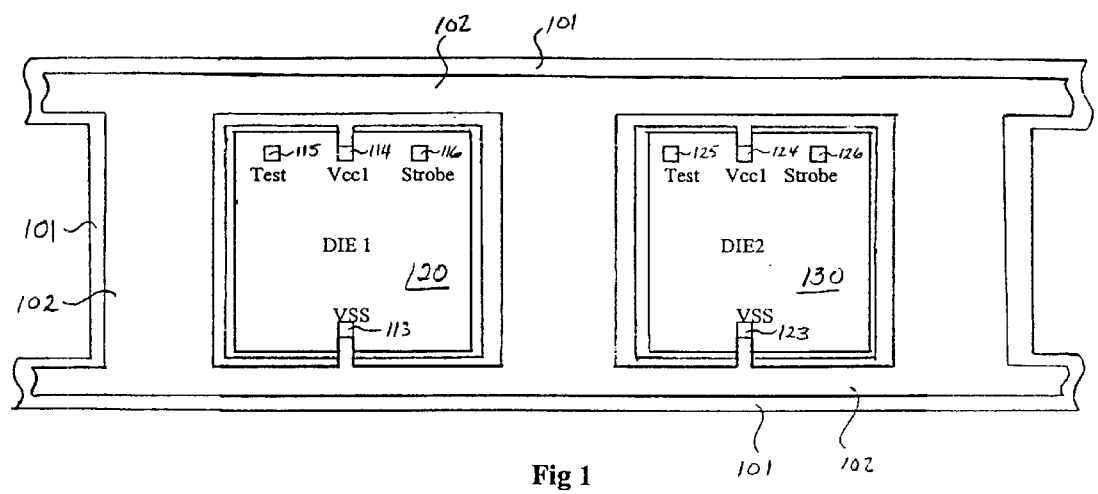
FIG. 1 illustrates a portion of a wafer including two dies and scribe line areas in accordance with the present invention.

FIG. 1 shows a portion of a wafer including two dies 120 and 130 in accordance with the present invention. Dies 120 and 130, as well as other dies on the wafer not shown are identical, although the invention is not limited to wafers with identical dies. Each of dies 120 and 130 includes a Vcc1 pad for receiving a power supply voltage, and a VSS pad for receiving a ground potential. The areas between the dies on a wafer are commonly referred to as the scribe line areas. Conventionally, one or more metal layers, which are grounded during wafer sort, run through the scribe line areas. Two metal lines 101 and 102 are shown running horizontally and vertically in the scribe line areas around dies 120 and 130.

Metal line 101 is electrically connected to the Vcc1 pads of dies 120 and 130, and thus carries the Vcc1 supply voltage during testing. Metal line 102 is electrically connected to the VSS pads of dies 120 and 130, and thus carries the ground potential during testing. Although FIG. 1 shows only two metal lines in the scribe line areas, the invention is not limited as such. Wafers having dies with additional power supply pads, e.g., VPP pad for receiving high voltage supply, may include additional metal lines in the scribe line areas for connection to these power supply pads. Also, metal lines 101 and 102 are shown as being stacked, and thus are from two separate metal layers. Either metal line can be from the top layer metal although in a preferred embodiment the top layer metal is connected to Vcc1 and the bottom layer metal is connected to VSS. Additional layers of metal in the scribe line area, if any, may be connected to the ground potential VSS.

In one embodiment, each die 120,130 includes a built-in self test (BIST) circuitry (not shown) which enables automatic testing of the die upon initiating a BIST operation. The BIST circuitry is conventionally designed to identify whether the die in which it is housed is defective, as well as the type of defects. Two additional pads, marked as Test and Strobe in each die 120,130, are used in the BIST operation. The Test pad is used to enable the BIST operation, and the Strobe pad is used to initiate the BIST operation. By requiring two signals to initiate BIST operation, accidental BIST initiation due to noise or other factors is prevented. Pad Vcc1 is used to provide power to the die during the BIST operation only. As such, a separate VCC pad (not shown) not connected to the metal lines in the scribe line areas is used to supply power to the die in all other die operations.

The wafer sort test, in accordance with one embodiment of the present invention, includes two steps: (i) initiate BIST operation, and (ii) follow-up operation. In the BIST initiating step, the probe card is placed on, for example, die 120. The probe card supplies the appropriate power supply voltages to Vcc1 and VSS pads, as well as the control signals to the Strobe and Test pads in order to initiate the BIST operation. Once the BIST operation is properly initiated in die 120, the probe card is moved to the next die, e.g., die 130, to similarly initiate the BIST operation in die 130. Thus, the probe card is moved from die 120 to die 130 while the BIST operation in die 120 continues and is eventually completed. Upon completion of the BIST operation, die 120 is automatically powered down to eliminate static power consumption by die 120. In this manner, the BIST operation in multiple dies overlap, reducing the overall wafer sort testing time compared to the conventional method of sequential testing of dies.

The BIST operation once initiated automatically performs the following steps: (i) perform designed-in test functions, (ii) store the test data reflective of the test results in one or more status registers, and (iii) power down the die. In one embodiment, upon initiation of the BIST operation, a switch, e.g., a MOS transistor, connected between Vcc1 pad and the internal power lines is closed by a BIST enable signal whereby power is transferred from Vcc1 pad to the internal circuitry. The switch is automatically opened upon completion of the BIST operation to cut off the power to the die. The status registers in this embodiment must be non-volatile (e.g., EPROM or Flash EPROM or EEPROM based) so that the stored test data is not lost when the power is removed from the die.

The Vcc1 pad of all dies on the wafer are shorted together via metal line 101. Thus, when the probe card contacts the Vcc1 pad of any die, power is supplied to all other dies via metal line 101. However, during the time the probe card transitions from one die to another, the power provided by the probe card is removed from the wafer. During this transition period, a number of dies may be at different stages of the BIST operation, and thus require power from another source. The large capacitance associated with metal line 101 supplies the requisite power to the dies during the transition period.

Because metal line 101 extends many times across the entire wafer, it possesses a large capacitance. Test equipment are typically capable of sourcing large amounts of current, e.g., more than 10 Amperes in the case of memory testers. Thus, the tester charges the large capacitance associated with metal line 101 every time the probe card comes in contact with the Vcc1 pad of a die. During the probe card transition period, the stored charge in metal line 101 capacitance provides the requisite power to those dies which are in the midst of the BIST operation.

Such reliance on the power provided by the charge stored in the capacitance of metal line 101 is quite reasonable because of: (i) the relatively small amount of power required by each die during BIST operation, e.g., 10–20 mA for memory devices, and (ii) the very short transition period of the probe card. In fact, the ratio of the time the probe card is in contact with each die to the time the probe card is in transition between dies can be adjusted so that metal line 101 remains fully charged during the transition periods. For example, the ratio may be set to 10:1 so that the probe card is in contact with each die for 10 seconds, and is in transition between two dies for 1 second. Clearly there are limitations on the ratio, such as how fast the tester can move the probe card form one die to another, and how quickly the BIST operation can be initiated.

The second step of follow-up operation in the wafer sort process involves evaluating the test data stored in the status registers in each die and performing the necessary steps indicated by the test data, e.g., repairing bad bits using redundancy, or discarding the die due to non-repairable defects. In the follow-up operation, open and short tests on all pins of each die may also be carried out.

The BIST initiating step may be carried out using a probe card having only the requisite number of probe pins for BIST initiation. In the embodiment of FIG. 1, only four probe pins are required for making contact to the four pads shown. For the follow-up operation, however, a different probe card with probe pins for all pads on the die, excluding Vcc1, Test and Strobe pads, may be used. This approach requires the additional step of changing the probe card after completion of the BIST initiation step, but minimizes the number of times the die pads are contacted by the probe pins of the probe cards. Excessive landing of probe pins on die pads can damage the pads and cause shorts or open failures. Alternatively, the step of changing probe cards between the two wafer sort steps can be eliminated at the expense of multiple landings on the die pads by using a single probe card with probe pins for all pads on the die, including Vcc1, Test, and Strobe pads.

In another embodiment, metal line 101 connected to Vcc1 pad of every die is powered by a power source other than the probe card. That is, metal line 101 is powered by a power source brought into electrical contact with metal line 101 at all times during wafer sort. In this embodiment, the reliance on the capacitance of metal layer 101 to provide the required power to the dies during probe card transition times is eliminated. Also, since power is provided to the dies at all times during wafer sort, the status registers used to store the test data in the BIST operation may be volatile, e.g., CMOS cross coupled latches. This simplifies the device processing requirements. Also, Vcc1 pad and the associated switch may be eliminated since the normal VCC pad can supply power to the die during BIST operation.

In yet another embodiment, the dies on the wafer are divided in a number of groups, and an algorithm is used to carry out the BIST operation for each group. The BIST operation is carried out in two steps for each group of dies. In the first step, the probe card sequentially contacts the dies in a first group to enable the BIST operation in these dies. In the second step, the BIST operation is initiated for all dies of the first group simultaneously.

During the first step, the dies in each group are merely enabled so that the BIST operation can later be initiated, and thus no power is consumed. In the first step, the probe card contacts the first die of the first group to enable the BIST operation in that die by initially raising the supply voltage applied to the Vcc1 pad to a first level, and then applying a BIST enable signal to the Test pad. The probe card then sequentially contacts the remaining dies of the first group to enable the BIST operation in each die. Upon contacting each of the remaining dies, the first voltage level is maintained on the Vcc1 pad and the BIST operation is enabled in the die by applying the BIST enable signal to the corresponding Test pad. Because the dies in the first group do not consume power during the BIST enable step, the first voltage level on metal line 101 can be maintained during the probe card transition between the dies in the group.

In the second step, after enabling the BIST operation in the last die of the first group of dies, and while maintaining the probe card on the last die, the BIST operation is initiated for all dies of the first group by switching the supply voltage applied to the Vcc1 pad to a second level.

After the BIST operation is completed for the first group of dies, the supply voltage applied to Vcc1 pad may be switched back to the first voltage level, and the same sequence of steps may be carried out to perform the BIST operation for another group of dies.

Conventional sensing techniques may be used to detect the first and second voltage levels. This embodiment has the advantages of minimizing the reliance on the capacitance of the metal line 101 to provide power to the dies during the probe card transition periods, and eliminate the need to retrofit the test apparatus to provide power to the metal lines 101 and 102 at all times during wafer sort.

While the above is a complete description of preferred embodiments of the present invention, it is possible to use various alternatives, modifications, and equivalents. For example, the present invention is not limited to using a single probe card for wafer sort. The present invention yields similar time savings in applications where two probe cards are used to test two dies simultaneously. Also, metal lines 101 and 102 are shown in FIG. 1 as being stacked, i.e., one metal line is from a first layer metal and the other metal line is from a second layer metal. However, metal lines 101 and 102 may be from the same layer metal running along the same plane. Further, the dies on the wafer may be divided into two or more groups with each group having independent VCC and VSS metal lines. Also, in each die only one power supply pad may be used to receive power for all operations rather than having a Vcc1 pad for BIST operation and a separate VCC pad for all other operations. Therefore, the scope of the present invention should be determined not with reference to the above description but should, instead, be determined with reference to the appended claims, along with their full scope of equivalents.

What is claimed is:

1. A method for testing a plurality of dies of a wafer, the method comprising:
    placing the wafer in a tester for testing the plurality of dies;
    initiating a built-in self test (BIST) operation in a first die; and
    initiating a BIST operation in a second die after initiating the BIST operation in the first die so that the BIST operation in the first die and the BIST operation in the second die overlap.

2. The method of claim 1 wherein each of the plurality of dies has a circuit, the method further comprising:
    upon initiating the BIST operation in each of the first and second dies,
    supplying power to the circuit;
    performing designed-in test operations; and
    storing in a register data reflecting the results of the designed-in test operations.

3. The method of claim 2 further comprising:
    upon completion of the BIST operation for all the plurality of dies, evaluating the data stored in the register of each die to determine the action to be taken with respect to each die.

4. A method for testing a plurality of dies of a wafer wherein each of the plurality of dies has a circuit, a first contact pad configured to receive a power supply voltage, a second contact pad configured to receive a reference voltage, and a contact pad configured to receive a control signal for initiating a built-in self test (BIST) operation, the first and second pads being coupled to the circuit for powering the circuit, the method comprising:
    bringing at least three probe pins of a probe card into electrical contact with a respective one of the first, second, and third pads of a first die of the plurality of dies;
    initiating a BIST operation in the first die;
    removing the probe card from the first die;
    bringing the at least three probe pins of the probe card into electrical contact with a respective one of the first, second and third pads of a second die of the plurality of dies; and
    initiating a BIST operation in the second die,
    wherein the BIST operation in the first and second dies overlap.

5. The method of claim 4 wherein the plurality of dies are separated by scribe line areas having at least a first conductive line and a second conductive line, the first conductive line being electrically connected to the first pad of each of said plurality of dies and the second conductive line being electrically connected to the second pad of each of said plurality of dies.

6. The method of claim 2 further comprising:
    after said storing step, removing power from the circuit.

7. The method of claim 2 further comprising:
    after said storing step, powering down the circuit to eliminate static current drawn by the circuit.

8. The method of claim 1 further comprising:
    bringing one or more probe pin(s) of a probe card into electrical contact with one or more pad(s) on the first die to initiate the BIST operation in the first die;
    removing the probe pin(s) from the pad(s) on the first die; and
    bringing the probe pin(s) into electrical contact with one or more pad(s) on the second die to initiate the BIST operation in the second die.

* * * * *